United States Patent
Kozuma (10) Patent No.: US 9,200,952 B2
(45) Date of Patent: Dec. 1, 2015

(54) SEMICONDUCTOR DEVICE COMPRISING A PHOTODETECTOR AND AN ANALOG ARITHMETIC CIRCUIT

(75) Inventor: Munehiro Kozuma, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 279 days.

(21) Appl. No.: 13/535,551

(22) Filed: Jun. 28, 2012

(65) Prior Publication Data

US 2013/0015332 A1    Jan. 17, 2013

(30) Foreign Application Priority Data

Jul. 15, 2011    (JP) ................. 2011-156200

(51) Int. Cl.
| | |
|---|---|
| *G01J 1/44* | (2006.01) |
| *H04N 5/235* | (2006.01) |
| *H04N 5/374* | (2011.01) |
| *H04N 5/378* | (2011.01) |
| *H04N 5/232* | (2006.01) |
| *H01L 29/786* | (2006.01) |

(52) U.S. Cl.
CPC ............... *G01J 1/44* (2013.01); *H04N 5/23212* (2013.01); *H04N 5/374* (2013.01); *H04N 5/378* (2013.01); *H01L 29/7869* (2013.01)

(58) Field of Classification Search
CPC ....... H03K 17/78; H03K 17/79; H03K 19/14; H03K 3/42; H03K 17/785; G01J 1/32; G01J 1/44; H01J 40/14; H03F 3/08; H03F 3/087; H01L 31/09; H01L 29/00; H01L 27/1443; H01L 31/12; H05B 33/0815; H02M 1/32; H02M 7/48; H02M 7/538; H02M 7/5387; H02H 7/122

USPC ............. 250/214 SW, 214 R, 214.1, 214 LS, 250/208.1; 257/292–294; 327/514; 363/56.01; 348/292–311; 396/166, 333

See application file for complete search history.

(56) References Cited

U.S. PATENT DOCUMENTS 4,158,492 A * 6/1979 Kitaura et al. ................ 396/161
5,731,856 A    3/1998 Kim et al.

(Continued)

FOREIGN PATENT DOCUMENTS

| | | | |
|---|---|---|---|
| EP | 1737044 A | 12/2006 | |
| EP | 2226847 A | 9/2010 | |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Que T Le
*Assistant Examiner* — Carolynn A Moore
(74) *Attorney, Agent, or Firm* — Eric J. Robinson; Robinson Intellectual Property Law Office, P.C.

(57) ABSTRACT

Provided is a photodetector in which narrowing of a detecting range of light is suppressed. The photodetector includes a photodetector circuit for outputting a first optical data signal and a second optical data signal in which values are determined in accordance with an illuminance of incident light, an analog arithmetic circuit to which the first optical data signal and the second optical data signal are input and in which an arithmetic processing is performed with the use of the first optical data signal and the second optical data signal, and a switching circuit for switching an arithmetic processing in the analog arithmetic circuit between an addition operation and a subtraction operation of the first optical data signal and the second optical data signal.

12 Claims, 4 Drawing Sheets

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,747,638 B2 | 6/2004 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,271,835 B2 | 9/2007 | Iizuka et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,525,523 B2 | 4/2009 | Yamazaki et al. | |
| 7,663,165 B2 | 2/2010 | Mouli | |
| 7,674,650 B2 | 3/2010 | Akimoto et al. | |
| 7,732,819 B2 | 6/2010 | Akimoto et al. | |
| 7,773,136 B2 * | 8/2010 | Ohyama et al. | 348/276 |
| 8,669,511 B2 * | 3/2014 | Doege | 250/214 R |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0133692 A1 * | 6/2005 | Watanabe et al. | 250/214 A |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0157760 A1 | 7/2006 | Hayashi et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0018075 A1 | 1/2007 | Cazaux et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0049115 A1 * | 2/2008 | Ohyama et al. | 348/222.1 |
| 2008/0050595 A1 | 2/2008 | Nakagawara et al. | |
| 2008/0054319 A1 | 3/2008 | Mouli | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0101948 A1 | 4/2009 | Park et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0295769 A1 | 12/2009 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117991 A1 | 5/2010 | Koyama et al. | |
| 2010/0182282 A1 | 7/2010 | Kurokawa et al. | |
| 2011/0062314 A1 * | 3/2011 | Doege | 250/214 R |
| 2011/0216448 A1 * | 9/2011 | Hisada et al. | 361/18 |
| 2011/0279720 A1 * | 11/2011 | Nakagawa et al. | 348/300 |
| 2011/0291013 A1 | 12/2011 | Kurokawa et al. | |
| 2012/0044223 A1 | 2/2012 | Tamura | |
| 2012/0168609 A1 * | 7/2012 | Krymski | 250/208.1 |
| 2013/0016035 A1 | 1/2013 | Ikeda | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-223490 | 8/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-356699 | 12/2004 |
| JP | 2007-065239 A | 3/2007 |
| JP | 2009-187342 A | 8/2009 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2002, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", (56) References Cited

OTHER PUBLICATIONS

SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Tanaka.K et al., "45.5: A System LCD with Optical Input Function using Infra-Red Backlight Subtraction Scheme,", SID Digest '10 : SID International Symposium Digest of Technical Papers, 2010, pp. 680-683.

Jeon.S et al., "180nm Gate Length Amorphous InGaZnO Thin Film Transistor for High Density Image Sensor Applications,", IEDM 10: Technical Digest of International Electron Devices Meeting, Dec. 6, 2010, pp. 504-507.

\* cited by examiner

SEMICONDUCTOR DEVICE COMPRISING A PHOTODETECTOR AND AN ANALOG ARITHMETIC CIRCUIT

BACKGROUND OF THE INVENTION

1. Field of the Invention

An embodiment of the present invention relates to a photodetector.

2. Description of the Related Art

In recent years, technological development of a photodetector which inputs data with the use of a photodetector circuit (also referred to as an optical sensor) capable of generating data having a value corresponding to the illuminance of incident light, a photodetector which inputs data with the use of the photodetector circuit and outputs data in accordance with the input data, and the like have been advanced.

As an example of the photodetector, an image sensor can be given. As examples of the image sensor, a charge coupled device (CCD) image sensor, a complementary metal oxide semiconductor (CMOS) image sensor, and the like can be given (e.g., Patent Document 1).

In the photodetector disclosed in Patent Document 1, in one photodetector circuit, two optical data signals are generated and output to one optical conversion element and a difference data signal of the two optical signals is generated, so that adverse effects of noise can be reduced and data transmission rate can be increased by reducing the amount of data.

REFERENCE

[Patent Document 1] Japanese Patent Published Application No. 2004-356699

SUMMARY OF THE INVENTION

However, since a plurality of optical data signals are generated in one photodetector circuit in the above photodetector, a range of values of the optical data signal which can be generated is narrower in accordance with the illuminance of incident light than that in the case where one optical data signal is generated in one photodetector circuit. Thus, the number of values of a gray scale that can be expressed by a data signal generated from an optical data signal is reduced. That is, the detecting range of light is narrowed, which is a problem. This problem becomes pronounced particularly when the illuminance of incident light is larger than a reference value.

An object of an embodiment of the present invention is to suppress narrowing of the detecting range of light.

In an embodiment of the present invention, in order to suppress narrowing of the detecting range of light, which arithmetic processing is performed in an arithmetic circuit is determined in accordance with whether or not the illuminance of incident light is larger than a reference value when an output data signal is generated by performing an arithmetic operation with the use of two optical data signals.

An embodiment of the present invention is a photodetector including a photodetector circuit for outputting a first optical data signal and a second optical data signal in which values are determined in accordance with the illuminance of incident light, an analog arithmetic circuit to which the first optical data signal and the second optical data signal are input and in which an arithmetic processing is performed with the use of the first optical data signal and the second optical data signal, and a switching circuit for switching the arithmetic processing in the analog arithmetic circuit between an addition operation and a subtraction operation of the first optical data signal and the second optical data signal.

According to an embodiment of the present invention, a range of generable values of data signal can be prevented from narrowing, whereby the detecting range of light can be prevented from narrowing.

DETAILED DESCRIPTION OF THE INVENTION

Examples of embodiments of the present invention will be described below with reference to the drawings. Note that it will be readily appreciated by those skilled in the art that details of the embodiments can be modified in various ways without departing from the spirit and scope of the present invention. The present invention is therefore not limited to the following description of the embodiments.

Note that the contents in different embodiments can be combined with one another as appropriate. In addition, the contents in different embodiments can be interchanged with one another.

Further, the ordinal numbers such as "first" and "second" are used to avoid confusion between components and do not limit the number of each component.

(Embodiment 1)

In this embodiment, an example of a photodetector is described.

A structural example of the photodetector in this embodiment is described with reference to FIGS. 1A and 1B.

Figure 1A:
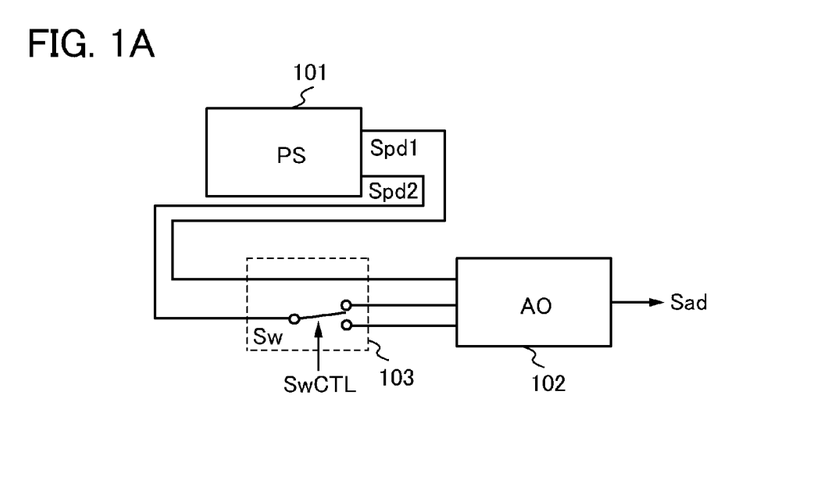
FIGS. 1A and 1B are diagrams showing examples of a photodetector in Embodiment 1.

The photodetector in FIG. 1A includes a photodetector circuit (also referred to as PS) 101, an analog arithmetic circuit (also referred to as AO) 102, and a switching circuit (also referred to as Sw) 103.

The photodetector circuit 101 has a function of outputting a first optical data signal Spd1 and a second optical data signal Spd2 in which values are determined in accordance with the illuminance of incident light.

The first optical data signal Spd1 and the second optical data signal Spd2 are input to the analog arithmetic circuit 102. The analog arithmetic circuit 102 has a function of performing an arithmetic processing with the use of the first optical data signal Spd1 and the second optical data signal Spd2 and outputting a potential based on the results of the arithmetic processing, as an output signal Sad. Note that the structure is not limited to that in FIG. 1A, and first optical data signals Spd1 and second optical data signals Spd2 output from a plurality of photodetector circuits 101 may be input to one analog arithmetic circuit 102.

The switching circuit 103 has a function of switching an arithmetic processing in the analog arithmetic circuit 102 between an addition operation and a subtraction operation of the first optical data signal Spd1 and the second optical data signal Spd2. For example, as shown in FIG. 1A, the arithmetic processing in the analog arithmetic circuit 102 can be switched by switching a terminal of the analog arithmetic circuit 102 to which the second optical data signal Spd2 is input with the switching circuit 103. The switching circuit 103 is controlled by a switching control signal (also referred to as a signal SwCTL) in which value is determined in accordance with the illuminance of light entering the photodetector. The value of the switching control signal can be determined in accordance with the value of the output signal Sad of the analog arithmetic circuit 102, for example.

The switching circuit 103 includes a first selection transistor and a second selection transistor, for example.

The switching control signal is input to a gate of the first selection transistor. The first selection transistor has a function of selecting whether or not to perform an addition operation of the first optical data signal Spd1 and the second optical data signal Spd2 in the analog arithmetic circuit 102.

An inverted signal of the switching control signal is input to a gate of the second selection transistor. The second selection transistor has a function of selecting whether or not to perform a subtraction operation of the first optical data signal Spd1 and the second optical data signal Spd2 in the analog arithmetic circuit 102.

Figure 1B:
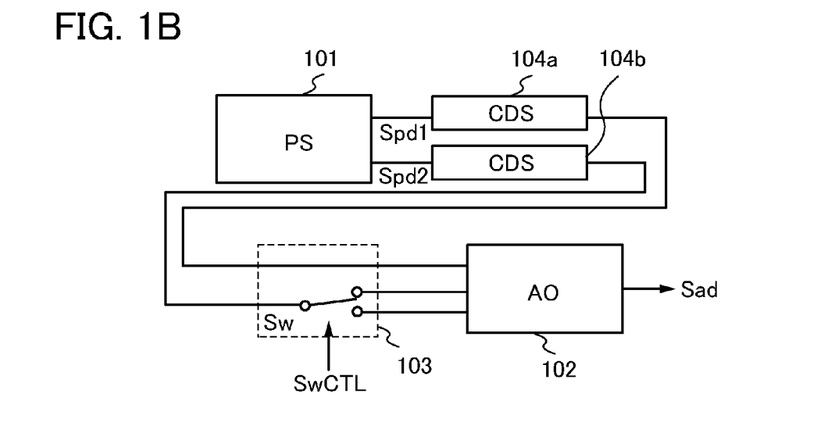

Note that as shown in FIG. 1B, correlated double sampling circuits (also referred to as CDS) 104a and 104b may be provided between the photodetector circuit 101 and the switching circuit 103. When the correlated double samplings 104a and 104b are provided, adverse effects of variation in characteristics of the photodetector on the first optical data signal Spd1 and the second optical data signal Spd2 can be reduced.

Next, a specific example of the photodetector in FIG. 1A is described with reference to FIGS. 2A to 2C.

Figure 2A:
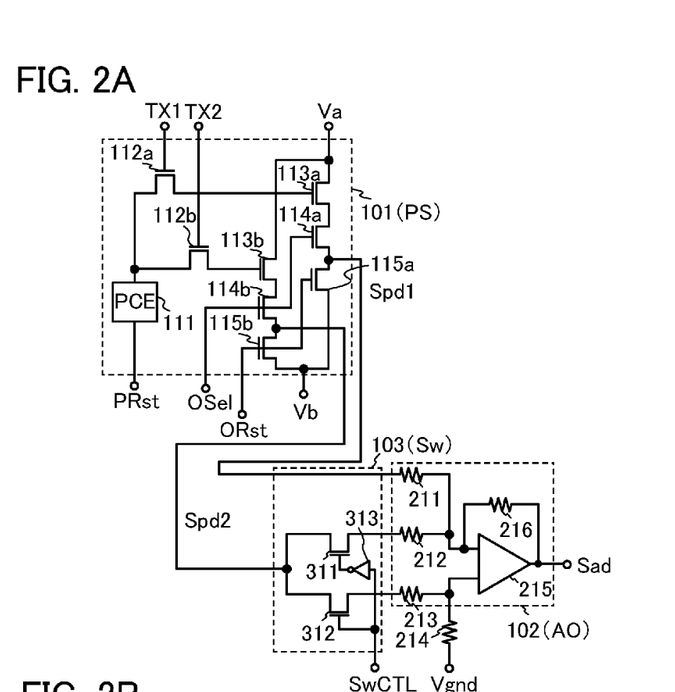
FIGS. 2A to 2C are diagrams showing an example of a photodetector in Embodiment 1.
Figures 2B, 2C:
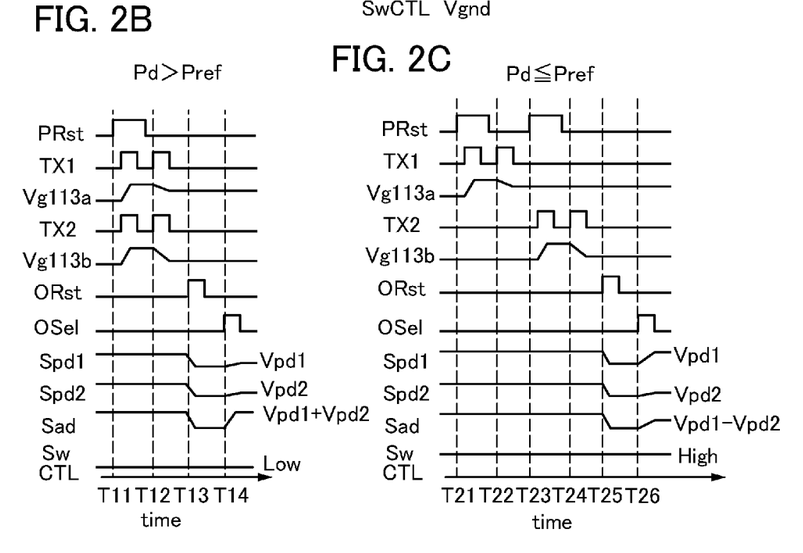

The photodetector circuit 101 in the photodetector shown in FIG. 2A includes a photoelectric conversion element (also referred to as PCE) 111 and transistors 112a, 112b, 113a, 113b, 114a, 114b, 115a, and 115b.

The photoelectric conversion element 111 includes a first current terminal and a second current terminal, and current (also referred to as photocurrent) flows between the first current terminal and the second current terminal in accordance with the illuminance of incident light.

A photodetection reset signal (also referred to as a signal PRst) that is a pulse signal is input to the first current terminal of the photoelectric conversion element 111. Alternatively, the photodetector in this embodiment may have a structure in which, instead of the photodetection reset signal, a potential Va is input to the first current terminal of the photoelectric conversion element 111. In this case, a structure may be employed in which a photodetection reset transistor which is a field-effect transistor is provided, the potential Va is input to one of a source and a drain of the photodetection reset transistor, the other of the source and the drain of the photodetection reset transistor is connected to gates of the transistors 113a and 113b, and the photodetection reset signal is input to a gate of the photodetection reset transistor.

As the photoelectric conversion element 111, a photodiode, a phototransistor, or the like can be used. When the photoelectric conversion elements are photodiodes, one of an anode and a cathode of the photodiode corresponds to the first current terminal of the photoelectric conversion element, and the other of the anode and the cathode of the photodiode corresponds to the second current terminal of the photoelectric conversion element. When the photoelectric conversion elements are phototransistors, one of a source and a drain of the phototransistor corresponds to the first current terminal of the photoelectric conversion element, and the other of the source and the drain of the phototransistor corresponds to the second current terminal of the photoelectric conversion element.

One of a source and a drain of the transistor 112a is connected to the second current terminal of the photoelectric conversion element 111, and a first charge accumulation control signal (also referred to as a signal TX1) that is a pulse signal is input to a gate of the transistor 112a.

One of a source and a drain of the transistor 112b is connected to the second current terminal of the photoelectric conversion element 111, and a second charge accumulation control signal (also referred to as a signal TX2) that is a pulse signal is input to a gate of the transistor 112b.

The transistors 112a and 112b have a function of selecting whether or not to perform a charge accumulation operation in the photodetector circuit 101, and serve as a charge accumulation control transistor with the function.

A transistor with low off-state current, for example, can be used as the transistors 112a and 112b. In this case, the off-state current per micrometer of channel width of the transistors 112a and 112b is 10 aA ($1\times10^{-17}$ A) or lower, preferably 1 aA ($1\times10^{-18}$ A) or lower, more preferably 10 zA ($1\times10^{-20}$ A) or lower, further preferably 1 zA ($1\times10^{-21}$ A) or lower, still further preferably 100 yA ($1\times10^{-22}$ A) or lower.

As the above transistor with low off-state current, it is possible to use a transistor including a semiconductor layer in which a channel is formed and which has a wider band gap than silicon, for example, 2 eV or more, preferably 2.5 eV or more, more preferably 3 eV or more. An example of the transistor having a wide band gap is a field-effect transistor including an oxide semiconductor layer in which a channel is formed.

As the oxide semiconductors layer, for example, an In-based oxide (e.g., indium oxide), a Sn-based oxide (e.g., tin oxide), and a Zn-based oxide (e.g., zinc oxide) can be given.

Alternatively, as the oxide semiconductor layer, a four-component metal oxide, a three-component metal oxide, or a two-component metal oxide may be used, for example. Note that the oxide semiconductor layer may include gallium as a stabilizer for reducing variation in characteristics. A metal oxide which can be used as the above oxide semiconductor may include tin as a stabilizer. A metal oxide which can be used as the above oxide semiconductor may include hafnium as a stabilizer. A metal oxide which can be used as the above oxide semiconductor may include aluminum as a stabilizer. A metal oxide which can be used as the above oxide semiconductor may include one or more of the following materials as a stabilizer: lanthanum, cerium, praseodymium, neodymium, samarium, europium, gadolinium, terbium, dysprosium, holmium, erbium, thulium, ytterbium, and lutetium, which are lanthanoid. Further, the metal oxide that can be used as the oxide semiconductor may contain silicon oxide.

For example, as a four-component metal oxide, for example, an In—Sn—Ga—Zn-based oxide, an In—Hf—Ga—Zn—based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

As a three-component metal oxide, for example, an In—Ga—Zn-based oxide, an In—Sn—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, or the like can be used.

As a two-component metal oxide, for example, an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, an In—Ga-based oxide, or the like can be used.

For the above oxide semiconductor layer, an oxide including a crystal with c-axis alignment (also referred to as a c-axis aligned crystal (CAAC)), which has a triangular or hexagonal atomic arrangement when seen from the direction of an a-b plane, a surface, or an interface can be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

The potential Va is input to one of a source and a drain of the transistor 113a, and the gate of the transistor 113a is electrically connected to the other of the source and the drain of the transistor 112a. The potential of the first optical data signal Spd1 is determined in accordance with a current flowing between the source and the drain of the transistor 113a.

The potential Va is input to one of a source and a drain of the transistor 113b, and the gate of the transistor 113b is electrically connected to the other of the source and the drain of the transistor 112b. The potential of the second optical data signal Spd2 is determined in accordance with a current flowing between the source and the drain of the transistor 113b.

The transistors 113a and 113b have a function of amplifying photocurrent of the photoelectric conversion element 111, and serve as amplifier transistors having the function. By using the transistor including an oxide semiconductor layer in which a channel is formed as the transistors 112a and 112b, charges of gates of the transistors 113a and 113b can be held longer when the transistors 112a and 112b are in off-states.

One of a source and a drain of the transistor 114a is electrically connected to the other of the source and the drain of the transistor 113a. An output selection signal (also referred to as a signal OSel) that is a pulse signal is input to a gate of the transistor 114a. The first optical data signal Spd1 is output through the other of the source and the drain of the transistor 114a.

One of a source and a drain of the transistor 114b is electrically connected to the other of the source and the drain of the transistor 113b. The output selection signal (also referred to as a signal OSel) that is a pulse signal is input to a gate of the transistor 114b. The second optical data signal Spd2 is output through the other of the source and the drain of the transistor 114b.

The transistor 114a has a function of selecting whether or not to output a potential having a value in accordance with the current flowing between the source and the drain of the transistor 113a, as the first optical data Spd1, and serves as an output selection transistor having the function. The transistor 114b has a function of selecting whether or not to output a potential having a value in accordance with the current flowing between the source and the drain of the transistor 113b, as the second optical data Spd2, and serves as an output selection transistor having the function. Note that the transistors 114a and 114b are not necessarily provided; however, with the transistors 114a and 114b, the timing of outputting optical data from the photodetector can be easily set.

One of a source and a drain of the transistor 115a is electrically connected to the other of the source and the drain of the transistor 114a. The other of the source and the drain of the transistor 115a is supplied with a potential Vb, and a gate of the transistor 115a is supplied with an output reset signal (also referred to as a signal ORst).

One of a source and a drain of the transistor 115b is electrically connected to the other of the source and the drain of the transistor 114b. The other of the source and the drain of the transistor 115b is supplied with the potential Vb, and a gate of the transistor 115b is supplied with the output reset signal (also referred to as a signal ORst).

The transistors 115a and 115b have a function of resetting potentials of the first optical signal Spd1 and the second optical signal Spd2, and serve as output reset transistors having the function. Note that the transistors 115a and 115b are not necessarily provided in the photodetector circuit 101; however, the other of the source and the drain of the transistors 115a and the other of the source and the drain of the transistor 115b need to be electrically connected to a wiring through which the first optical signal Spd1 and the second optical signal Spd2 are output.

Note that one of the potentials Va and Vb is a high power supply potential Vdd, and the other is a low power supply potential Vss. The absolute value of the difference between the values of the potentials Va and Vb is preferably larger than at least the absolute value of the threshold voltage of the amplifier transistor. The values of the potentials Va and Vb might interchange depending on, for example, the conductivity type of the transistor.

As the transistors 113a, 113b, 114a, 114b, 115a, and 115b, for example, a transistor including an oxide semiconductor layer functioning as a channel formation layer, a transistor including a semiconductor layer containing a semiconductor (e.g., silicon) belonging to Group 14 of the periodic table, or the like can be used.

Further, in the photodetector shown in FIG. 2A, the analog arithmetic circuit 102 includes a resistor 211, a resistor 212, a resistor 213, a resistor 214, an operational amplifier 215, and a resistor 216.

The operational amplifier 215 includes a first input terminal, a second input terminal, and an output terminal. The first input terminal of the operational amplifier 215 is electrically connected to the other of the source and the drain of the transistor 114a in the photodetector circuit 101 through the resistor 211. The output terminal of the operational amplifier 215 is electrically connected to the first input terminal of the operational amplifier 215 through the resistor 216.

Further, in the photodetector shown in FIG. 2A, the switching circuit 103 includes the transistor 311, the transistor 312, and an inverter 313.

One of a source and a drain of the transistor 311 is electrically connected to the other of a source and a drain of the transistor 114b in the photodetector circuit 101. The other of the source and the drain of the transistor 311 is electrically connected to the first input terminal of the operational amplifier 215 in the analog arithmetic circuit 102 through the resistor 212. A gate of the transistor 311 is supplied with the inverted signal of the switching control signal SwCTL from the inverter 313.

One of a source and a drain of the transistor 312 is electrically connected to the other of the source and the drain of the transistor 114b in the photodetector circuit 101. The other of the source and the drain of the transistor 312 is electrically connected to the second input terminal of the operational amplifier 215 in the analog arithmetic circuit 102 through the resistor 213, and is grounded (becomes Vgnd) through the resistor 214. The switching control signal SwCTL is input to a gate of the transistor 312.

As the transistors 311 and 312, for example, a transistor including an oxide semiconductor layer functioning as a channel formation layer, a transistor including a semiconductor layer containing a semiconductor (e.g., silicon) belonging to Group 14 of the periodic table, or the like can be used.

Next, a method for driving the photodetector shown in FIG. 2A is described with reference to timing charts in FIGS. 2B and 2C. Here, the resistance value of the resistor 211 is the same as that of the resistor 212. The resistance value of the resistor 214 over the resistance value of the resistor 213 is the same as the resistance value of the resistor 211 over the resistance value of the resistor 216. In addition, the transistors 112a, 112b, 113a, 113b, 114a, 114b, 311, and 312 are n-channel transistors. Further, the potential Va is a high power supply potential Vdd, and the potential Vb is a low power supply potential Vcc (Vgnd, here).

In an example of the method for driving the photodetector shown in FIG. 2A, an operation is different between the case where the illuminance (Pd) of light entering the photodetector is larger than a reference potential (Pref) and the case where the illuminance of light entering the photodetector is smaller than the reference potential (Pref). Each operation is described below.

In the case where the illuminance of light entering the photodetector is larger than the reference potential (Pref) (i.e., Pd>Pref), the values of the first optical data signal Spd1 and the second optical data signal Spd2 are small. In that case, the analog arithmetic circuit 102 performs an addition operation of the first optical data signal Spd1 and the second optical data signal Spd2. For example, as shown in FIG. 2B, the switching control signal SwCTL has a low level potential (also referred to as a Low state), the transistor 311 is turned on, and the transistor 312 is turned off.

In a time T11, while a pulse of the photodetection reset signal (signal PRst) is input, pulses of the first charge accumulation control signal (signal TX1) and the second charge accumulation control signal (signal TX2) are input. Thus, the transistors 112a and 112b are turned on and the photodetector circuit 101 is in a reset state.

After the pulse of the photodetection reset signal (signal PRst) is input, the pulses of the first charge accumulation control signal (signal TX1) and the second charge accumulation control signal (signal TX2) are input again in a time T12, so that the potential of the gate of the transistor 113a (Vg113a) and the potential of the gate of the transistor 113b (Vg113b) are determined in accordance with a photocurrent flowing through the photoelectric conversion element 111.

After the pulses of the first charge accumulation control signal (signal TX1) and the second charge control signal (signal TX2) are input, the pulse of the output reset signal (signal ORst) is input in a time T13. Thus, the transistors 115a and 115b are turned on, and the potentials of the first optical data signal Spd1 and the second optical data signal Spd2 are reset.

Then, a pulse of the output selection signal (signal OSel) is input in a time T14. Thus, the transistors 114a and 114b are turned on and the values of the first optical data signal Spd1 and the second optical data signal Spd2 are determined. In FIG. 2B, the value of the first optical data signal Spd1 (Vpd1) and the value of the second optical data signal Spd2 (Vpd2) are the same. Thus, two data are output in accordance with the illuminance of light entering the photodetector circuit 101.

At this time, the potential of the output signal Sad output from the analog arithmetic circuit 102 is the sum of the potentials of the first optical data signal Spd1 and the second optical data signal Spd2 (i.e., Vpd1+Vpd2). That is, an addition operation of the first optical data signal Spd1 and the second optical data signal Spd2 is performed.

On the other hand, in the case where the illuminance (Pd) of light entering the photodetector is smaller than the reference value (Pref) (i.e., Pd≤Pref), the values of the first optical data signal Spd1 and the second optical data signal Spd2 are large. In that case, the analog arithmetic circuit 102 performs a subtraction operation of the first optical data signal Spd1 and the second optical data signal Spd2. For example, as shown in FIG. 2C, the switching control signal SwCTL has a high level potential (also referred to as a High state), the transistor 311 is turned on, and the transistor 312 is turned on.

In a time T21, while the pulse of the photodetection reset signal (signal PRst) is input, the pulse of the first charge accumulation control signal (signal TX1) is input. Thus, the transistor 112a is turned on and the photodetector circuit 101 is in a reset state.

After the pulse of the photodetection reset signal (signal PRst) is input, the pulse of the first charge accumulation control signal (signal TX1) is input again in a time T22, so that the potential of the gate of the transistor 113a is determined in accordance with the photocurrent flowing through the photoelectric conversion element 111.

Further, in a time T23, while the pulse of the photodetection reset signal (signal PRst) is input, the pulse of the second charge accumulation control signal (signal TX2) is input. Thus, the transistor 112b is turned on and the photodetector circuit 101 is in a reset state.

After the pulse of the second charge accumulation control signal (signal TX2) is input and the pulse of the photodetection reset signal (signal PRst) is input, the pulse of the photodetection reset signal (signal PRst) is input again in a time T24, so that the potential of the gate of the transistor 113a is determined in accordance with the photocurrent flowing through the photoelectric conversion element 111.

After the pulse of the second charge control signal (signal TX2) is input, the pulse of the output reset signal (signal ORst) is input in a time T25. Thus, the transistors 115a and 115b are turned on, and the potentials of the first optical data signal Spd1 and the second optical data signal Spd2 are reset.

Then, the pulse of the output selection signal (signal OSel) is input in a time T26. Thus, the transistors 114a and 114b are turned on and the values of the first optical data signal Spd1 and the second optical data signal Spd2 are determined. In FIG. 2C, the value of the first optical data signal Spd1 (Vpd1) and the value of the second optical data signal Spd2 (Vpd2) are different. Thus, two data are output in accordance with the illuminance of light entering the photodetector circuit 101.

Note that when the value of the first optical data signal Spd1 is determined during a first frame period, the second optical data signal Spd2 may be determined during a frame period which is one or more later after the first frame period. Alternatively, it is possible that after a pulse of the first charge accumulation control signal (signal TX1) is input, a pulse of the output selection signal (signal OSel) is input during a time T22 and a time T23, the transistors 114a and 114b are turned on, and the values of the first optical data signal Spd1 and the second optical data signal Spd2 are determined.

At this time, the potential of the output signal Sad of the analog arithmetic circuit 102 is obtained by subtracting the potential of the second optical data signal Spd2 from the potential of the first optical data signal Spd1 (i.e., Vpd1-Vpd2). That is, a subtraction operation of the first optical data signal Spd1 and the second optical data signal Spd2 is performed.

The above is the example of the method for driving the photodetector shown in FIG. 2A.

As described with reference to FIGS. 1A and 1B and FIGS. 2A to 2C, in an example of the photodetector in this embodiment, with the use of the switching circuit, when the illuminance of light entering the photodetector is larger than the reference value, the two optical data signals which are output from the photodetector circuit are added in order to increase the value of the output signal (data signal) of the analog arithmetic circuit. Thus, a range of values, which can be generated, of the output signal (data signal) of the analog arithmetic circuit can be extended, so that the number of values of a gray scale that can be expressed by the output signal (data signal) can be increased. That is, the detecting range of light can be prevented from narrowing.

(Embodiment 2)

In this embodiment, an example of a photodetector is described.

Figure 3A:
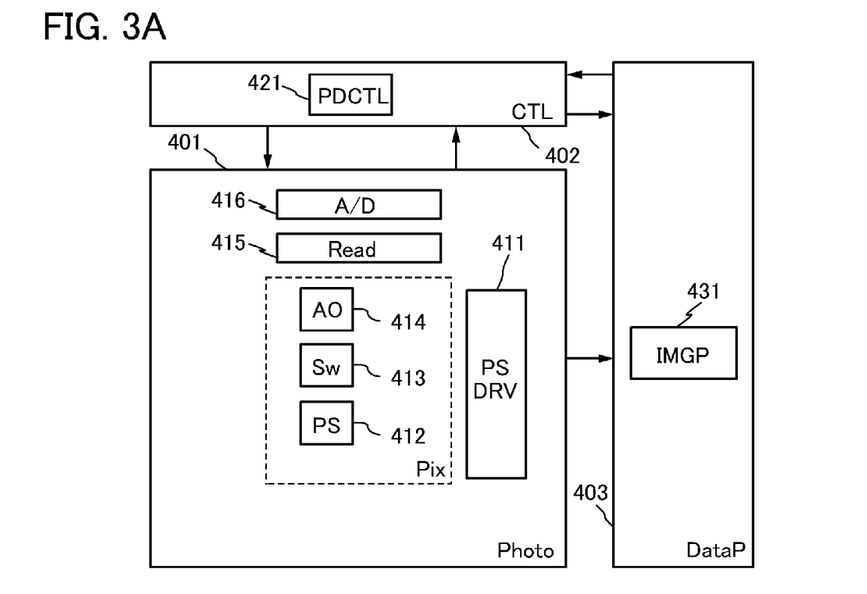
FIGS. 3A and 3B are diagrams showing examples of a photodetector in Embodiment 2.
Figure 3B:
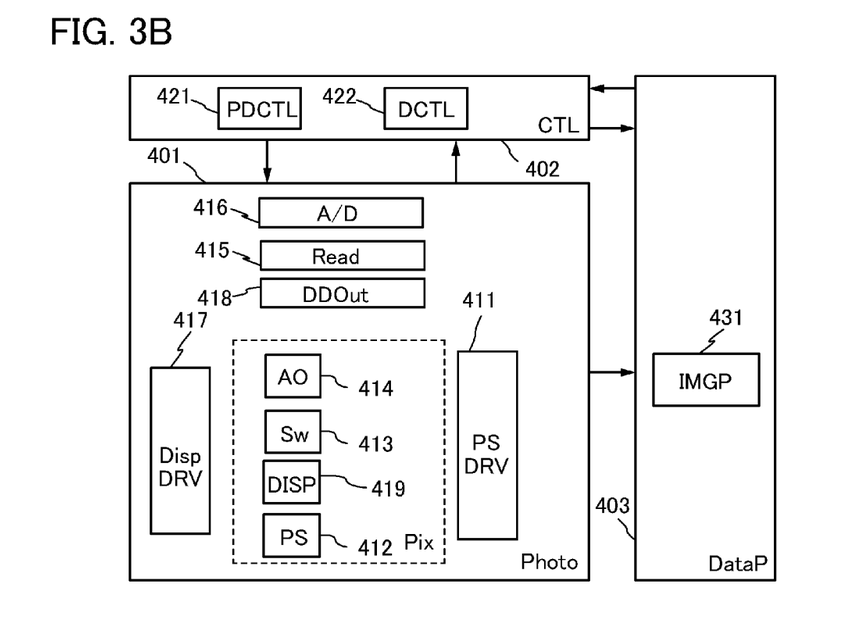

First, a structural example of the photodetector in this embodiment is described with reference to FIGS. 3A and 3B. FIGS. 3A and 3B are block diagrams illustrating structural examples of the photodetector in this embodiment.

A photodetector illustrated in FIG. 3A is an input device which can input data with light. A photodetector illustrated in FIG. 3B is an input/output device which can input data with light and can output data by displaying an image.

The photodetectors shown in FIGS. 3A and 3B each include a photodetection portion (also referred to as Photo) 401, a control portion (also referred to as CTL) 402, and a data processing portion (also referred to as DataP) 403.

In addition, the photodetectors shown in FIGS. 3A and 3B each include a photodetection driver circuit (also referred to as PSDRV) 411, a plurality of photodetector circuits (also referred to as PS) 412, a switching circuit (also referred to as Sw) 413, an analog arithmetic circuit (also referred to as AO) 414, a reading circuit (also referred to as Read) 415, an A/D converter circuit (also referred to as A/D) 416, a photodetection control circuit 421, and an image processing circuit 431.

The photodetector shown in FIG. 3B includes a display driver circuit 417, a display-data-signal output circuit 418, a plurality of display circuits 419, and a display control circuit 422.

The plurality of photodetector circuits 412 is provided in a pixel portion Pix. Note that one or more photodetector circuits 412 form one pixel in the photodetector shown in FIG. 3A. In addition, the plurality of display circuits 419 is provided in the pixel portion Pix. Note that one or more display circuits 419 form one pixel in the photodetector shown in FIG. 3B. Alternatively, one pixel may be formed by one or more photodetector circuits 412 and one or more display circuits 419.

The photodetection driver circuit 411 is a circuit for controlling a photodetection operation.

The photodetector driving circuit 411 outputs at least a photodetection reset signal, a charge accumulation control signal, and an output selection signal which are pulse signals.

The photodetection driver circuit 411 has, for example, at least three shift registers. In this case, the photodetection driver circuit 411 outputs a pulse signal from the first shift register in order to output the photodetection reset signal, outputs a pulse signal from the second shift register in order to output the charge accumulation control signal, and outputs a pulse signal from the third shift register in order to output an output selection signal.

The photodetector circuit 412 generates optical data having a potential of a value based on the illuminance of incident light.

A photodetector circuit in the photodetector in Embodiment 1 can be used as the photodetector circuit 412.

Note that it is also possible to generate the data of a full-color image signal by providing photodetector circuits receiving red light, photodetector circuits receiving green light, and photodetector circuits receiving blue light as the plurality of photodetector circuits 412, generating optical data by these photodetector circuits, and combining the generated optical data of different colors. In addition to these photodetection circuits, one or more photodetection circuits receiving light of the following colors: cyan, magenta, and yellow may be provided. When one or more photodetection circuits receiving light of one or more the following colors: cyan, magenta, and yellow are provided, the kind of colors that can be represented in a displayed image based on generated image signals can be increased. For example, by providing a coloring layer, which transmits light of a particular color, in a photodetector circuit and letting light in the photodetector circuit through the coloring layer, optical data that is a potential having a value corresponding to the illuminance of light of a particular color can be generated.

A switching circuit in the photodetector in Embodiment 1 can be used as the switching circuit 413.

An analog arithmetic circuit in the photodetector in Embodiment 1 can be used as the analog arithmetic circuit 414.

The reading circuit 415 has a function of reading optical data. The reading circuit 415 reads optical data from the photodetector circuit 412.

The reading circuit 415 includes, for example, a selection circuit. For example, the selection circuit includes a transistor and can read optical data when optical data is input to the selection circuit as an optical data signal in accordance with the behavior of the transistor.

The A/D converter circuit 416 has a function of converting analog data which is input from the reading circuit 415 into digital data. Note that the A/D converter circuit 416 is not necessarily provided in the photodetection portion 401.

The display driver circuit 417 controls the display operation of the display circuit 419.

The display driver circuit 417 includes, for example, a shift register. In this case, the display driver circuit 417 can output a plurality of pulse signals from the shift register, and thus can output a signal for controlling the display circuits 419 (e.g., a display selection signal (also referred to as a signal DSEL)). Alternatively, the display driver circuit 417 may include a plurality of shift registers. In this case, the display driver circuit 417 can output a plurality of pulse signals from each of the plurality of shift registers, and thus can output a plurality of signals for controlling the display circuits 419.

An image signal is input to the display data signal output circuit 418. The display data signal output circuit 418 has a function of generating a display data signal (also referred to as a signal DD) based on the inputted image signal and outputting the generated display data signal.

The display data signal output circuit 418 includes a plurality of transistors, for example.

The display data signal output circuit 418 can output the data of an input signal as a display data signal when the transistor is in the on state. The transistor can be controlled by input of a control signal which is a pulse signal to the current control terminal. Note that in the case where the number of display circuits 419 is more than one, a plurality of switching transistors may be selectively turned on or off so that data of image signals is output as a plurality of display data signals.

A display data signal is input to each of the plurality of display circuits 419. Each of the plurality of display circuits 419 changes its display state in accordance with the input display data signal.

As the display circuit 419, a display circuit using a liquid crystal element, a display circuit using an electroluminescent (EL) element, or the like can be used, for example.

Note that it is also possible to display a full-color image in the pixel portion by providing a display circuit emitting red light, a display circuit emitting green light, and a display circuit emitting blue light and by making these display circuits emit light. In addition to these display circuits, one or more display circuits emitting light of one or more of the following colors: cyan, magenta, and yellow may be provided. When one or more display circuits emitting light of one or more of the following colors: cyan, magenta, and yellow are provided, the kind of colors that can be represented in a displayed image can be increased, so that the quality of the displayed image can be improved. For example, a light-emitting element and a coloring layer that transmits light of a particular color emitted from the light-emitting element are provided in a display circuit and light is emitted from the light-emitting element so as to pass the coloring layer, thereby achieving the emission of light of the particular color. This structure enables a full-color image to be displayed without forming a plurality of light emitting elements emitting light of different colors, thereby facilitating the manufacturing process, enhancing yield, and improving the quality and reliability of the light emitting elements.

The photodetection control circuit 421 has a function of controlling an operation of a circuit for a photodetection operation. For example, a switching control signal SwCTL which is input to the switching circuit 413 is generated by the photodetection control circuit 421.

The display control circuit 422 has a function of controlling an operation of a circuit for a display operation.

The image processing circuit 431 has a function of generating image data with the use of an optical data signal generated in the photodetection portion. Further, the image processing circuit 431 can perform an operation of comparing the illuminance of light entering the photodetector with a reference value.

Next, an example of a method for driving the photodetector in FIG. 3A or 3B is described.

First, an example of a method for driving the photodetector in FIG. 3A is described.

In the photodetector shown in FIG. 3A, in the photodetector circuit 412, two optical data are generated in accordance with the illuminance of incident light and are output as a first optical data signal and a second optical data signal. The first optical data signal and the second optical data signal are input to the analog arithmetic circuit 414 through the switching circuit 413, and are subjected to an arithmetic processing by the analog arithmetic circuit 414. Which arithmetic operation is performed is determined in accordance with the value of the switching control signal SwCTL input to the switching circuit 413.

Further, the optical data which is output from the analog arithmetic circuit 414 is read by the reading circuit 415. The optical data which is read is converted into digital data by the A/D conversion circuit 416 and is subjected to a predetermined processing.

Further, the value of the optical data and the reference value are compared by the image processing circuit 431, and the value of a control signal of the photodetection control circuit 421 is determined in accordance with the comparison results. Here, the value of the switching control signal SwCTL is also determined. Thus, an operation of the switching circuit 413 and an operation of the analog arithmetic circuit 414 can be controlled in accordance with the illuminance of light entering the photodetector.

Next, an example of a method for driving the photodetector in FIG. 3B is described.

In the photodetector illustrated in FIG. 3B, the display circuits 419 are selected row by row by the display driver circuit 417, and display data signals are input sequentially to the display circuits 419 in each of the selected rows.

The display circuit 419 to which a display data signal has been input changes its display state in accordance with data of the input display data signal; whereby, an image is displayed by the pixel portion Pix.

In the photodetector shown in FIG. 3B, in the photodetector circuit 412, two optical data which are potentials in accordance with the illuminance of incident light are generated and are output as a first optical data signal and a second optical data signal. The first optical data signal and the second optical data signal are input to the analog arithmetic circuit 414 through the switching circuit 413, and are subjected to an arithmetic processing by the analog arithmetic circuit 414. Which arithmetic operation is performed is determined in accordance with the value of the switching control signal SwCTL input to the switching circuit 413.

Further, the optical data which is output from the analog arithmetic circuit 414 is read by the reading circuit 415. The optical data which is read is converted into digital data by the A/D conversion circuit 416 and is subjected to a predetermined processing such as control of the display control circuit 422 or generation of image data of the object to be detected.

Further, the value of the optical data and the reference value are compared by the image processing circuit 431, and the value of a control signal of the photodetection control circuit 421 is determined in accordance with the comparison results. Here, the value of the switching control signal SwCTL is also determined. Thus, an operation of the switching circuit 413 and an operation of the analog arithmetic circuit 414 can be controlled in accordance with the illuminance of light entering the photodetector.

The above are the descriptions of the examples of the methods for driving the photodetectors shown in FIGS. 3A and 3B.

As described with reference to FIGS. 3A and 3B, in an example of the photodetector in this embodiment, the value of the switching control signal can be determined in accordance with the illuminance of light entering the photodetector. Thus, an arithmetic processing in the analog arithmetic circuit can be switched in accordance with the illuminance of light entering the photodetector. Note that without limitation thereon, an illuminance sensor may be provided additionally and a switching control signal may be determined in accordance with output data from the illuminance sensor.

(Embodiment 3)

In this embodiment, examples of electronic devices each including the photodetector described in the above embodiment are described.

Structural examples of the electronic devices of this embodiment are described with reference to FIGS. 4A to 4D. FIGS. 4A to 4D are schematic views each illustrating a structural example of an electronic device of this embodiment.

Figure 4A:
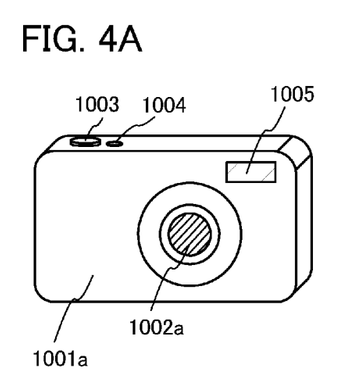
FIGS. 4A to 4D are diagrams showing structural examples of electronic devices in Embodiment 3.

An electronic device illustrated in FIG. 4A is a digital camera. The digital camera illustrated in FIG. 4A includes a housing 1001a, a lens 1002a, a shutter button 1003, a power button 1004, and a flashlight 1005.

Further, the digital camera includes the photodetector in any of the above embodiments (e.g., the photodetector shown in FIG. 3A) in the housing 1001a. With this structure, incident light is detected by the photodetector through the lens 1002a by pushing the shutter button 1003, so that an image can be taken, for example.

Figure 4B:
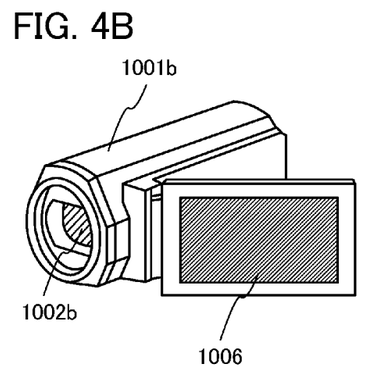

An electronic device illustrated in FIG. 4B is a video camera. The video camera illustrated in FIG. 4B includes a housing 1001b, a lens 1002b, and a display portion 1006.

Further, the video camera includes the photodetector in any of the above embodiments (e.g., the photodetector shown in FIG. 3A) in the housing 1001b. With this structure, incident light is detected by the photodetector through the lens 1002b, so that an image can be taken, for example.

Further, the video camera includes the photodetector in any of the above embodiments (e.g., the photodetector shown in FIG. 3B) in the display portion 1006. With this structure, the display portion 1006 can have a function as a touch panel, for example.

Figure 4C:
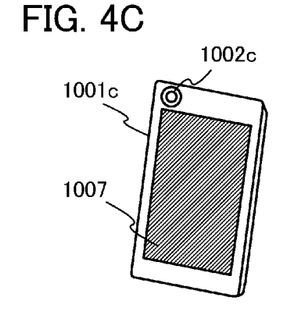

An electronic device illustrated in FIG. 4C is an example of a portable information terminal. The portable information terminal in FIG. 4C includes a housing 1001c, a lens 1002c provided in the housing 1001c, and a display portion 1007 provided in the housing 1001c.

Note that a side surface of the housing 1001c may be provided with one or both of a connection terminal for connecting the mobile information terminal to an external device and a button for operating the mobile information terminal in FIG. 4C.

The mobile information terminal in FIG. 4C includes a CPU, a main memory, an interface transmitting/receiving a signal traveling between the external device and each of the CPU and the main memory, and an antenna transmitting/receiving a signal to/from the external device, in the housing 1001c. Note that in the housing 1001c, one or plural integrated circuits having a specific function may be provided.

Further, the mobile information terminal includes the photodetector in any of the above embodiments (e.g., the photodetector shown in FIG. 3A) in the housing 1001c. With this structure, incident light is detected by the photodetector through the lens 1002c, so that an image can be taken, for example. The lens 1002c is provided in the surface where the display portion 1007 is provided; however, the lens 1002c may be provided in the surface which is on the opposite side of the surface where the display portion 1007 is provided.

Further, the mobile information terminal includes the photodetector in any of the above embodiments (e.g., the photodetector shown in FIG. 3B) in the display portion 1007. With this structure, the display portion 1007 can have a function as a touch panel, for example.

The mobile information terminal in FIG. 4C serves as one or more of a telephone set, an e-book reader, a personal computer, and a game machine, for example.

Figure 4D:
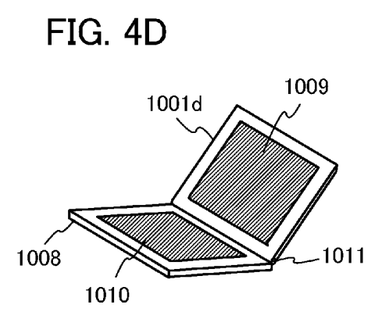

The electronic device illustrated in FIG. 4D is an example of a folding mobile information terminal. The mobile information terminal in FIG. 4D includes a housing 1001d, a display portion 1009 provided in the housing 1001d, a housing 1008, a display portion 1010 provided in the housing 1008, and a hinge 1011 for connecting the housing 1001d and the housing 1008.

In the portable information terminal in FIG. 4D, the housing 1001d can be stacked on the housing 1008 by moving the housing 1001d or the housing 1008 with the hinge 1011.

Note that a side surface of the housing 1001d or the housing 1008 may be provided with a connection terminal for connecting the portable information terminal to an external device and/or a button for operating the portable information terminal illustrated in FIG. 4D.

The display portion 1009 and the display portion 1010 may display different images or one image. Note that the display portion 1010 is not necessarily provided, and a keyboard which is an input device may be provided instead of the display portion 1010.

The mobile information terminal in FIG. 4D includes a CPU, a main memory, and an interface transmitting/receiving a signal traveling between the external device and each of the CPU and the main memory, in the housing 1001d or the housing 1008. Note that in the housing 1001d or the housing 1008, one or plural integrated circuits having a specific function may be provided. In addition, the mobile information terminal in FIG. 4D may include an antenna transmitting/receiving a signal to/from the external device.

Further, the mobile information terminal includes the photodetector in any of the above embodiments (e.g., the photodetector shown in FIG. 3B) in the housing 1001d or the housing 1008. With this structure, the housing 1001d or the housing 1008 can have a function as a touch panel, for example.

The portable information terminal illustrated in FIG. 4D has a function of one or more of a telephone set, an e-book reader, a personal computer, and a game machine.

As described with reference to FIGS. 4A to 4D, in the examples of the electronic devices according to this embodiment, the photodetectors in the above embodiments can be used. With the use of the photodetector, an electronic device which is capable of taking an image with high accuracy can be provided. This application is based on Japanese Patent Application serial No. 2011-156200 filed with Japan Patent Office on Jul. 15, 2011, the entire contents of which are hereby incorporated by reference.

What is claimed is:

1. A semiconductor device comprising:
a photodetector circuit comprising a photoelectric conversion element;
a switching circuit electrically connected to the photodetector circuit; and
an analog arithmetic circuit electrically connected to the switching circuit,
wherein the photodetector circuit and the switching circuit are discrete elements,
wherein the photodetector circuit and the analog arithmetic circuit are discrete elements,
wherein the photodetector circuit is configured to output a first optical data signal and a second optical data signal,
wherein each value of the first optical data signal and the second optical data signal is determined in accordance with an illuminance of incident light to the photoelectric conversion element,
wherein the first optical data signal and the second optical data signal are input to the analog arithmetic circuit,
wherein the analog arithmetic circuit is configured to perform an arithmetic processing using the first optical data signal and the second optical data signal,
wherein the switching circuit is configured to switch the arithmetic processing in the analog arithmetic circuit between an addition operation and a subtraction operation of the first optical data signal and the second optical data signal,
wherein the switching circuit is configured to switch the arithmetic processing in the analog arithmetic circuit between the addition operation and the subtraction operation of the first optical data signal and the second optical data signal depending on illuminance of light entering the photoelectric conversion element,
wherein the addition operation is performed in a case where the illuminance of light entering the photoelectric conversion element is larger than a reference value, and
wherein the subtraction operation is performed in a case where the illuminance of light entering the photoelectric conversion element is smaller than the reference value.

2. The semiconductor device according to claim 1, wherein the photodetector circuit comprising:
a first transistor;
a second transistor;
a third transistor; and
a fourth transistor,
wherein the photoelectric conversion element comprises a first current terminal and a second current terminal,
wherein a photocurrent flows between the first current terminal and the second current terminal in accordance with an illuminance of incident light,
wherein one of a source and a drain of the first transistor is electrically connected to the second current terminal of the photoelectric conversion element,
wherein one of a source and a drain of the second transistor is electrically connected to the second current terminal of the photoelectric conversion element,
wherein a gate of the third transistor is electrically connected to the other of the source and the drain of the first transistor,
wherein a potential of the first optical data signal is determined in accordance with a current flowing between a source and a drain of the third transistor,
wherein a gate of the fourth transistor is electrically connected to the other of the source and the drain of the second transistor,
wherein a potential of the second optical data signal is determined in accordance with a current flowing between a source and a drain of the fourth transistor,
wherein one of the source and the drain of the third transistor is electrically connected to a first input terminal of an operational amplifier,
wherein one of the source and the drain of the fourth transistor is electrically connected to a second input terminal of the operational amplifier, and
wherein an output signal of the analog arithmetic circuit is output from an output terminal of the operational amplifier.

3. The semiconductor device according to claim 2, wherein the switching circuit comprises:
a fifth transistor; and
a sixth transistor, wherein a switching control signal is input to a gate of the fifth transistor,
wherein the fifth transistor is configured to control whether or not to perform the addition operation of the first optical data signal and the second optical data signal in the analog arithmetic circuit,
wherein an inverted signal of the switching control signal is input to a gate of the sixth transistor, and
wherein the sixth transistor is configured to control whether or not to perform the subtraction operation of the first optical data signal and the second optical data signal in the analog arithmetic circuit.

4. The semiconductor device according to claim 3,
wherein the one of the source and the drain of the fourth transistor is electrically connected to one of a source and a drain of the fifth transistor,
wherein the one of the source and the drain of the fourth transistor is electrically connected to one of a source and a drain of the sixth transistor,
wherein the other of the source and the drain of the fifth transistor is electrically connected to the first input terminal of the operational amplifier, and
wherein the other of the source and the drain of the sixth transistor is electrically connected to the second input terminal of the operational amplifier.

5. The semiconductor device according to claim 1, wherein the switching circuit comprises:
a fifth transistor; and
a sixth transistor,
wherein a switching control signal is input to a gate of the fifth transistor,
wherein the fifth transistor is configured to control whether or not to perform the addition operation of the first optical data signal and the second optical data signal in the analog arithmetic circuit,
wherein an inverted signal of the switching control signal is input to a gate of the sixth transistor, and
wherein the sixth transistor is configured to control whether or not to perform the subtraction operation of the first optical data signal and the second optical data signal in the analog arithmetic circuit.

6. An electronic device comprising the semiconductor device according to claim 1.

7. A semiconductor device comprising:
a photodetector circuit comprising:
a first transistor comprising an oxide semiconductor;
a second transistor comprising an oxide semiconductor; and
a photoelectric conversion element electrically connected to one of a source and a drain of the first transistor and one of a source and a drain of the second transistor;
a switching circuit electrically connected to the photodetector circuit; and
an analog arithmetic circuit electrically connected to the switching circuit,
wherein the photodetector circuit and the switching circuit are discrete elements,
wherein the photodetector circuit and the analog arithmetic circuit are discrete elements,
wherein the photodetector circuit is configured to output a first optical data signal and a second optical data signal,
wherein each value of the first optical data signal and the second optical data signal is determined in accordance with an illuminance of incident light to the photoelectric conversion element,
wherein the first optical data signal and the second optical data signal are input to the analog arithmetic circuit,
wherein the analog arithmetic circuit is configured to perform an arithmetic processing using the first optical data signal and the second optical data signal,
wherein the switching circuit is configured to switch the arithmetic processing in the analog arithmetic circuit between an addition operation and a subtraction operation of the first optical data signal and the second optical data signal,
wherein the switching circuit is configured to switch the arithmetic processing in the analog arithmetic circuit between the addition operation and the subtraction operation of the first optical data signal and the second optical data signal depending on illuminance of light entering the photoelectric conversion element,
wherein the addition operation is performed in a case where the illuminance of light entering the photoelectric conversion element is larger than a reference value, and
wherein the subtraction operation is performed in a case where the illuminance of light entering the photoelectric conversion element is smaller than the reference value.

8. The semiconductor device according to claim 7, wherein the photodetector circuit comprises:
a third transistor; and
a fourth transistor, wherein the photoelectric conversion element comprises a first current terminal and a second current terminal, wherein a photocurrent flows between the first current terminal and the second current terminal in accordance with an illuminance of incident light, wherein the one of the source and the drain of the first transistor is electrically connected to the second current terminal of the photoelectric conversion element, wherein the one of the source and the drain of the second transistor is electrically connected to the second current terminal of the photoelectric conversion element, wherein a gate of the third transistor is electrically connected to the other of the source and the drain of the first transistor, wherein a potential of the first optical data signal is determined in accordance with a current flowing between a source and a drain of the third transistor, wherein a gate of the fourth transistor is electrically connected to the other of the source and the drain of the second transistor, wherein a potential of the second optical data signal is determined in accordance with a current flowing between a source and a drain of the fourth transistor, wherein one of the source and the drain of the third transistor is electrically connected to a first input terminal of an operational amplifier, wherein one of the source and the drain of the fourth transistor is electrically connected to a second input terminal of the operational amplifier, and wherein an output signal of the analog arithmetic circuit is output from an output terminal of the operational amplifier.

9. The semiconductor device according to claim 8, wherein the switching circuit comprises:

a fifth transistor; and a sixth transistor, wherein a switching control signal is input to a gate of the fifth transistor, wherein the fifth transistor is configured to control whether or not to perform the addition operation of the first optical data signal and the second optical data signal in the analog arithmetic circuit, wherein an inverted signal of the switching control signal is input to a gate of the sixth transistor, and wherein the sixth transistor is configured to control whether or not to perform the subtraction operation of the first optical data signal and the second optical data signal in the analog arithmetic circuit.

10. The semiconductor device according to claim 9, wherein the one of the source and the drain of the fourth transistor is electrically connected to one of a source and a drain of the fifth transistor, wherein the one of the source and the drain of the fourth transistor is electrically connected to one of a source and a drain of the sixth transistor, wherein the other of the source and the drain of the fifth transistor is electrically connected to the first input terminal of the operational amplifier, and wherein the other of the source and the drain of the sixth transistor is electrically connected to the second input terminal of the operational amplifier.

11. The semiconductor device according to claim 7, wherein the switching circuit comprises:

a fifth transistor; and a sixth transistor, wherein a switching control signal is input to a gate of the fifth transistor, wherein the fifth transistor is configured to control whether or not to perform the addition operation of the first optical data signal and the second optical data signal in the analog arithmetic circuit, wherein an inverted signal of the switching control signal is input to a gate of the sixth transistor, and wherein the sixth transistor is configured to control whether or not to perform the subtraction operation of the first optical data signal and the second optical data signal in the analog arithmetic circuit.

12. An electronic device comprising the semiconductor device according to claim 7.

* * * * *